United States Patent [19]

Hirtz et al.

[11] Patent Number: 5,138,407
[45] Date of Patent: Aug. 11, 1992

[54] TRANSISTOR MADE OF 3-5 GROUP SEMICONDUCTOR MATERIALS ON A SILICON SUBSTRATE

[75] Inventors: Jean-Pierre Hirtz, L'Haye les Roses; Marie-Nöelle Charasse, Paris; Thierry Pacou, Les Ulis; Alain Bosella, Epinay S/Orge; Pierre Briere, Rueil Malmaison, all of France

[73] Assignee: Thomson - CSF, Puteaux, France

[21] Appl. No.: 622,822

[22] Filed: Dec. 5, 1990

[30] Foreign Application Priority Data

Dec. 8, 1989 [FR] France .................. 89 16259

[51] Int. Cl.[5] .................................. H01L 29/08
[52] U.S. Cl. ................................ 357/22; 357/15; 357/16; 357/61
[58] Field of Search ............. 357/15, 16, 22, 61

[56] References Cited

U.S. PATENT DOCUMENTS

| 4,774,205 | 9/1988 | Choi et al. ................ | 357/16 |
| 4,826,784 | 5/1989 | Salerno et al. ............ | 357/16 |
| 4,845,044 | 7/1989 | Ariyoshi et al. .......... | 357/16 |
| 4,896,194 | 1/1990 | Suzuki ...................... | 357/16 |
| 4,914,053 | 4/1990 | Matyi et al. .............. | 357/16 |
| 4,952,527 | 8/1990 | Calawa et al. ............ | 357/15 |
| 5,016,065 | 5/1991 | Seki et al. ................ | 357/22 |

FOREIGN PATENT DOCUMENTS

| 2026315 | 2/1972 | France ..................... | 357/22 |
| 2207401 | 6/1974 | France ..................... | 357/22 |
| 2464562 | 3/1981 | France ..................... | 357/22 |
| 61-395581 | 2/1986 | Japan ....................... | 357/22 |
| 62-189761 | 8/1987 | Japan ....................... | 357/22 |

OTHER PUBLICATIONS

IEEE Electron Device Letters, vol. EDL-8, No. 8, Aug. 1987, "X-Band MMIC Amplifier on GaAs/Si" by Eron et al, pp. 350-352.
IEEE Transactions . . . vol. MTT 32, No. 3, Hirachi et al. "A Packaged . . . ".
Japanese Journal of Applied Physics. vol. 23, No. 12, Tonaka et al.
Journal of Vacuum Science . . . May-Jun. 1985, vol. 3, No. 3, NY U.S.

Primary Examiner—Rolf Hille
Assistant Examiner—Steven Loke
Attorney, Agent, or Firm—Roland Plottel

[57] ABSTRACT

The present invention concerns a transistor of semiconductor materials of the 3-5 group on silicon of the type comprising a silicon substrate, at least one layer of semi-insulating 3-5 material and several doped layers of 3-5 group semiconductor material in which is defined at least one conducting channel equipped with a gate metallization, each channel being situated between two access regions alternately known as source and drain, each source and drain regions with a metallization, one of the two access regions to a channel being electrically and thermally connected to the silicon substrate. In accordance with the invention, the transistor comprises between the silicon substrate and the semi-insulating layer of 3-5 group semiconductor material, at least one buffer layer of intrinsic silicon.

7 Claims, 3 Drawing Sheets

TRANSISTOR MADE OF 3-5 GROUP SEMICONDUCTOR MATERIALS ON A SILICON SUBSTRATE

BACKGROUND OF THE INVENTION

The present invention concerns a powerful semi-conducting device made of material of the 3-5 group such as GaAs on a silicon substrate and a manufacturing process for such a device.

To make transistors operating at millimetric frequencies, it is a known technique to use materials of the 3-5 group such as gallium arsenide, GaAs. However, although gallium arsenide and similar materials have good electrical performance, they are poor heat conductors, which restricts their use in powerful transistors.

To remedy these disadvantages, it has been envisaged to make transistors on a layer of 3-5 material, more particularly GaAs, which is grown on a silicon substrate. Silicon has the advantage of being a better heat conductor than gallium arsenide and can therefore act as a radiator dissipating heat.

To make use of this heat conduction property of silicon, it was proposed in French patent application no. 88 13155 filed by the Thomson Hybride and Microondes Company, to connect one of the channel access regions called source or drain to the silicon substrate via a metal core. This solution is particularly advantageous for powerful transistors. To obtain a powerful transistor, a sufficient gate width is required. However, the gate width is limited by the dephasing due to the RC circuit formed by the gate resistance and the parasite gate-drain and gate-source capacitances. This dephasing increases at high frequencies. To remedy this disadvantage, an interdigital structure was therefore proposed. This interdigital structure requires the sources and/or drains to be connected to each other. Thus, by using the metallic cores described in French patent no. 88 13144, it is possible to connect sources or drains using the silicon substrate which can be suitably doped to make it a conductor. In this case, the silicon substrate serves both as a radiator and as an electrical connection.

This solution, which is well-mastered from a technological point of view, has the disadvantage that is introduces parasite gate-source or drain-source capacitances which restrict the operation of the transistors to frequencies of less than 10 GHz.

These parasite capacitances are due to the thinness of the semi-insulating layer of gallium arsenide grown by epitaxy on the silicon substrate. To reduce these capacitances, a much thicker semi-insulating buffer layer would be necessary. However, recent progress in gallium arsenide epitaxy enables layers of gallium arsenide with good crystallographic qualities to be obtained for thicknesses of at most 6 $\mu$m on a silicon substrate. At greater thicknesses, the gallium arsenide has many defects and it is then impossible to create good circuits. Moreover, the use of a much thicker semi-insulating layer of gallium arsenide is not a good idea from a thermal point of view, since gallium arsenide is a poorer heat conductor than silicon. Thus, the thicker the semi-insulating gallium arsenide layer, the higher the thermal resistance of the transistor.

Consequently, the aim of the present invention is to provide a new powerful transistor of 3-5 material on silicon, enabling these disadvantages to be remedied.

SUMMARY OF THE INVENTION

The object of the present invention is a powerful transistor of 3-5 material on silicon of the type comprising a silicon substrate, at least one semi-insulating layer of 3-5 material and several layers of doped 3-5 material in which is defined at least on conducting channel equipped with a gate metallization, each channel being situated between two access regions alternately known as source and drain, each possessing a metallization, one of the two regions of access to a channel being electrically and thermally connected to the silicon substrate, characterized by the fact that is comprises, between the silicon substrate and the semi-insulating layer of 3-5 material, at least one buffer layer of intrinsic silicon.

This new structure is very interesting from a thermal point of view since it enables the heat to be evacuated by the silicon. Moreover, from an electrical point of view, the parasite drain-source and gate-source capacitances are reduced due to the thickening of the semi-insulating layer. The thickness of the silicon buffer layer is greater than or equal to 10 $\mu$m while the semi-insulating layer of 3-5 material, i.e. the gallium arsenide layer, is usually 4 $\mu$m. Such a structure enables frequencies of at least 12 GHz to be achieved.

The present invention also concerns different manufacturing processes for a powerful transistor of the above type.

According to a first manufacturing process, this comprises the following stages:

deposition by epitaxy of an intrinsic silicon buffer layer on a silicon substrate;

deposition by epitaxy of at least one layer of a semi-insulating 3-5 material on the buffer layer;

creation of a powerful transistor by known means on the layer of semi-insulating material, this transistor containing at least one conducting channel situated between two access regions known alternately as source and drain;

making at least one opening in the contact metallization of one of the two access regions, source or drain;

etching, through this or these opening(s) using a mask, of the layers of 3-5 material and intrinsic silicon, the etching stopping on contact with the silicon substrate;

deposit, at the bottom of the sink(s) obtained, of a metallic layer ensuring ohmic contact with the silicon substrate;

elimination of the mask and metal electrolytic recharging of the sink(s) until the metal core formed is coplanar with the metallization of the region is which it is formed.

Powerful transistors in accordance with the present invention can be made according to another manufacturing process which consists in making the ohmic source or drain contacts on the silicon substrate before the epitaxy of gallium arsenide or 3-5 materials on the silicon substrate. It is therefore possible, in this case, to anneal at temperatures of over 450° C. so as to obtain a good ohmic contact.

This manufacturing process is characterized by the following stages:

deposition by epitaxy on a silicon substrate of a buffer layer of intrinsic silicon;

using a mask, making at least one opening at the location of the future electrodes of one type of the two access regions, source of drain;

etching through this or these opening(s) of the buffer layer of intrinsic silicon, the etching stopping on contact with the silicon substrate;

deposition at the bottom of the sink(s) obtained, of a metal layer ensuring an ohmic contact with the silicon substrate;

elimination of the mask;

metal electrolytic recharge of the sink(s) until the metal core formed is coplanar with the buffer layer;

deposition of a layer of silica over the whole of the wafer;

etching, through a mask covering the above access regions, of the silica layer to the level of the buffer layer, and elimination of the mask;

deposition by epitaxy over the whole of the wafer of at least one layer of semi-insulating 3-5 material giving, above the buffer layer, a monocrystalline layer of 3-5 material;

Formation on the monocrystalline layer, in known manner, of a powerful transistor containing at least one conducting channel situated between two access regions alternately called source and drain;

etching, through a mask, of the layer of silica and the layers covering it so as to reach the metal core;

elimination of the mask;

electrolytic recharge of the drain and source electrodes.

BRIEF DESCRIPTION OF THE DRAWINGS

Other characteristics and advantages of the present invention will appear on reading the description of various modes of embodiment of a powerful transistor of 3-5 material on a silicon substrate made below with reference to the appended drawings in which.

DESCRIPTION OF THE PREFERRED EMBODIMENTS

The present invention will be described with reference to a powerful transistor of a gallium arsenide on a silicon substrate. Nevertheless, it is clear for the professional that the present invention applies to all powerful transistors made of rapid materials of the 3-5 group such as GaAs, GaAlAs, InP, GaInP, etc. on a silicon substrate. Moreover, in the figures a mesa structure has been shown. However, it is clear for the professional that the present invention also applies to planar transistors and integrated circuits. In addition, to simplify the description, the transistor has been simply represented by two active layers implanted in a semi-insulating layer of GaAs and by these three metallizations of source, gate and drain. The various buffer layers enabling the GaAs crystal lattice parameter to be adapted to the silicon layers' crystal lattice parameter have not been shown, this technique now being well known in the profession.

Figure 1:
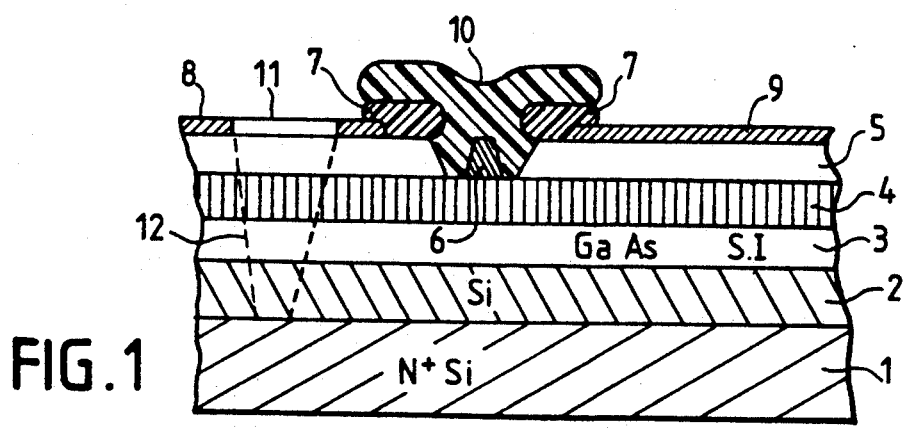
FIGS. 1, 2 and 3 are diagrammatic section views of a powerful transistor according to the invention constructed in accordance with the first manufacturing process.

In FIG. 1 has been represented a section view of the wafer of semi-conducting material at the stage preceding the piercing of the sink necessary to connect one of the transistor's access regions, i.e. the source in the mode of embodiment represent, to the silicon substrate. As shown in FIG. 1, the wafer of semi-conducting material is constituted essentially by a substrate 1 of silicon which is made electrically conducting by N+ or possibly P+ type doping. This substrate generally has a thickness of 200 to 400 μm reduced to 50 μm once it is finished. On the substrate 1, in accordance with the present invention, a layer of intrinsic silicon with a resistivity of 10,000 —/cm has been deposited by epitaxy. This layer is deposited preferably using a chemical vapor phase epitaxy technique and is at least 10 μm thick. On the buffer layer 2 of intrinsic silicon, a layer 3 of a semi-insulating materials of the 3-5 group, preferably a layer of gallium arsenide GaAs, has been deposited, using an epitaxy technique such as molecular beam epitaxy or metal organic chemical vapor deposition (MOCVD). This layer 3 of GaAs is 1 to 3.5 μm thick, and is constituted of semi-insulating GaAs which is not intentionally doped, i.e. its impurity content is about $10^{14}$, $10^{15}$, AT.Cm$^{-3}$.

On this layer 3, one or more layers constituting the active layer of the transistor have been grown by epitaxy or implanted in known manner. For example, a first layer 4 of N type doped GaAs and a layer 5 of N+ type doped GaAs have been deposited. These layers have a thickness of about 3000 Å for layer 4 and 1500 Å for layer 5.

Metallizations have been made using a conventional process for powerful transistor manufacture. Thus, the central region supports a gate metallization 6 made, for example, of titanium-aluminium. This metallization 6 is covered with a layer of silicon nitride 10 which rests on two silica steps 7, in accordance with the conventional process of transistor manufacture.

On each side of the gate 6 and the channel region, two metallizations 8 and 9 have been deposited on the access regions known as source and drain. As represented in FIG. 1 and in accordance with the present invention, an opening 11 has been made in the transistor access metallization 8, i.e. the source metallization which is generally the hottest. This opening 11 is used to etch a sink 12 in the layers 3, 4, 5 of GaAs and the layer 2 of intrinsic silicon. This sink 12 is symbolized by a dotted line in FIG. 2.

Figure 2:
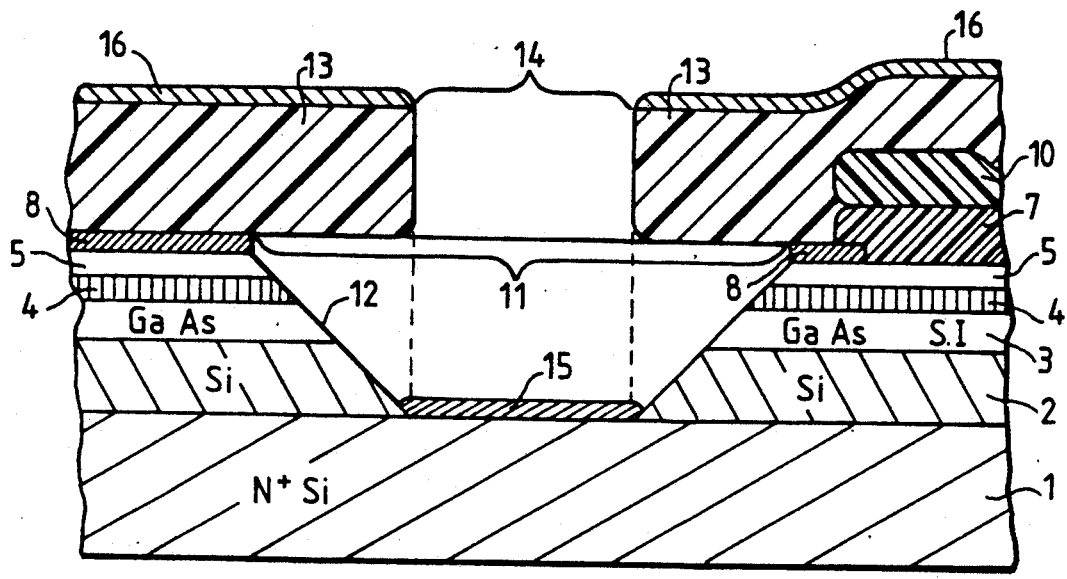

As shown in FIG. 2, to etch the sink 12, the wafer is covered on the transistor side with a thick layer 13 of photosensitive resist which is then masked and developed so as to create an opening 14, concentric with the opening 11 in the metallization 8. The opening 14 can be smaller because of the future sub-etching. The layers 5, 4, 3 of GaAs and the layer 2 of intrinsic silicon are then etched either by selective chemical etching using a known solution, or by chlorine plasma in freon. This etching stops at the silicon substrate 1. The sink 12 generally has sides inclined at 45° with respect to the substrate. Then, in accordance with the present invention, through the opening 14 a metal layer is deposited on the silicon substrate 1, for example a layer of chrome and gold, so as to make an ohmic contact 15. This layer is deposited by evaporation according to a known method.

To make a good ohmic contact, the layer of chrome and gold will be annealed at not more than 400° C. in order not to damage the layers of GaAs.

Then, using a known technique, the thick layer of photosensitive resist 13 is dissolved by an operation known as "lift-off", leaving the surface of the wafer free, and the same operation eliminates the Cr-Au layer 16 which was deposited on the resin layer 13 during evaporation.

Figure 3:
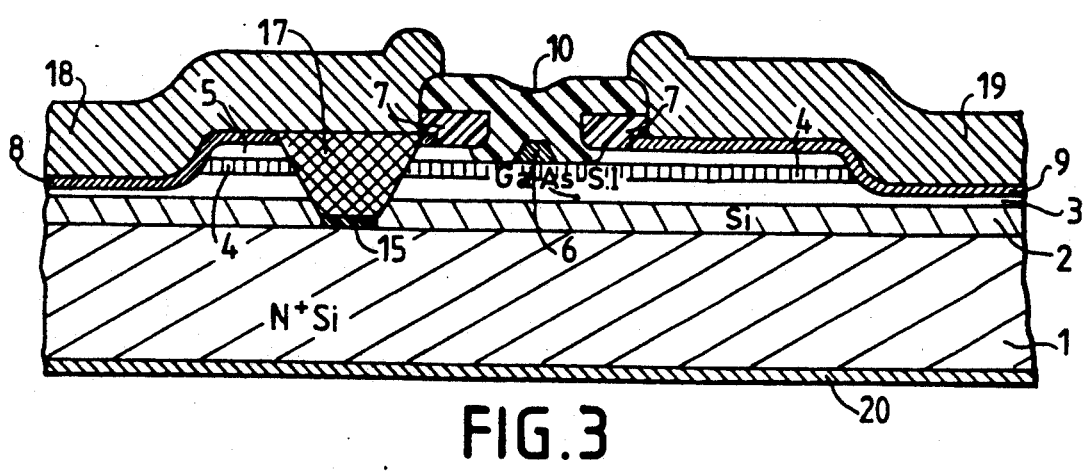

The ohmic contact 15 then serves, in combination with the conducting silicon substrate 1, to perform a recharge of electrolytic gold in the sink 12. This recharge is stopped when the metal core 17 thus created is coplanar with the metallization 8, as shown in FIG. 3. A final recharge of Ti-Pt-Au by evaporation of the source and drain metallizations 8 and 9 completes the transistor according to the invention as represented by the references 18 and 19. In addition, the back face of the substrate 1 is metallized to form the electrode 20 for access to the source(s). In known manner, before deposition of the metallization 20, the back face of the silicon substrate can be ground to reduce the thickness of the wafer, thus reducing the thermal impedance of the substrate 1 and facilitating heat transfer towards a metal base.

A preferential process for manufacturing a powerful transistor in accordance with the present invention will now be described with references to FIGS. 4a and 4g.

Figure 4A:
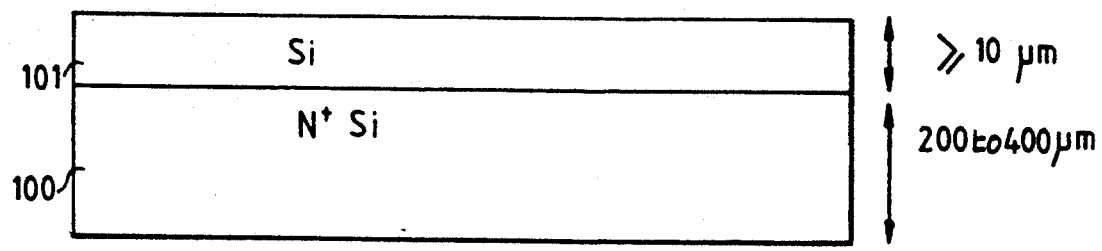
FIGS. 4a to 4g are diagrammatic section views of the different stages of construction of a powerful transistor in accordance with the second process according to the present invention.

As shown in FIG. 4a, a layer 101 of intrinsic silicon is deposited by epitaxy on a substrate 100 of silicon doped N+ to make it a conductor. Deposition by vapor-phase epitaxy is used by preference. As represented in FIG. 4a, the substrate 100 has a thickness of between 200 and 400 $\mu$m and the buffer layer of intrinsic silicon 101 has a thickness of over 10 $\mu$m.

Figure 4B:
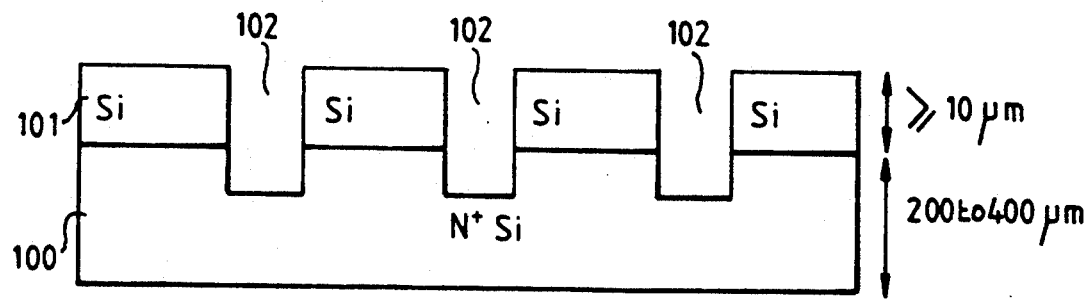

As represented in FIG. 4b, the buffer layer 101 of intrinsic silicon is etched. This is done using a mask in which have been made openings at the site of the source electrodes of the future transistor. This etching is performed preferably using a known plasma etching such as RIE (reaction ion etching). At the bottom of the sinks 102 thus created, a metallic layer 103 is deposited by evaporation, for example a chrome-gold layer, to make an ohmic contact on the silicon substrate 100. To obtain a good ohmic contact on the silicon, annealing is generally performed at temperatures of over 450° C.

Figure 4C:
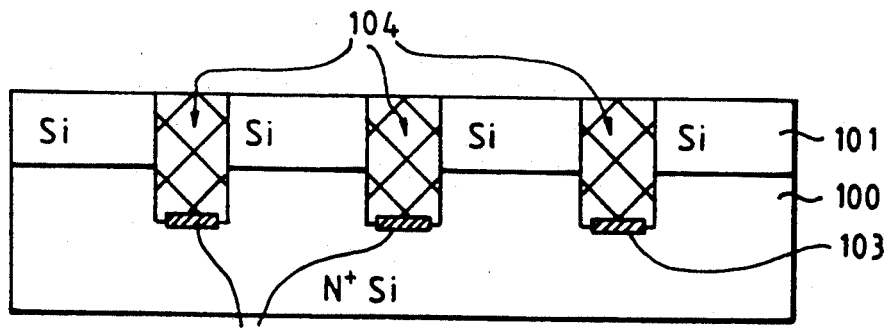

Then, as represented in FIG. 4c, the sinks 102 are made plane by recharging them with electrolytic gold as represented by the reference 104.

Figure 4D:
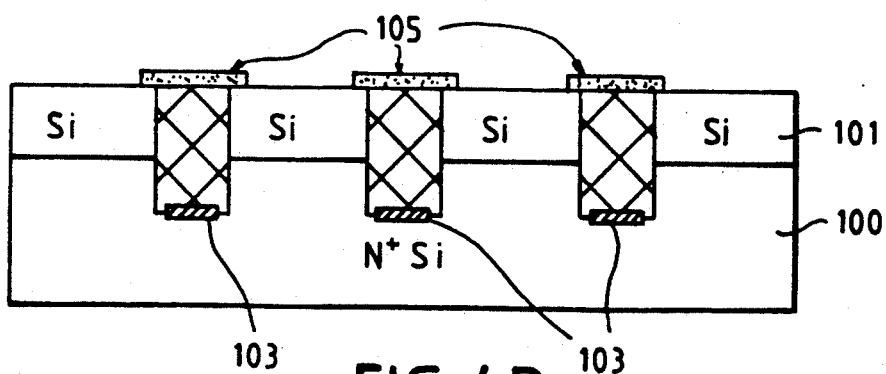

As represented in FIG. 4d, a layer of silica about 3000 Å thick is then deposited over the whole of the wafer. Then, using a mask, this silica layer is etched except at the sites of the future sources, so as to obtain silica pads 105.

Figure 4E:
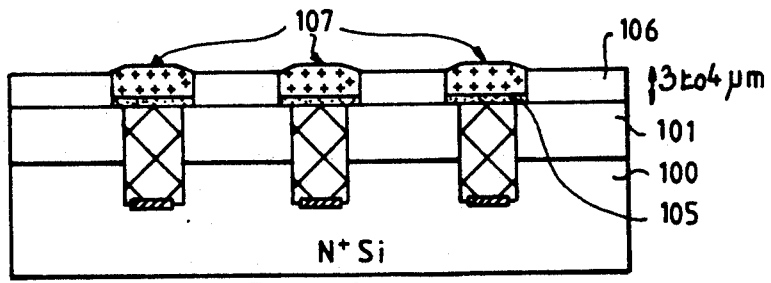

Then, as represented in FIG. 4e, a semi-insulating layer 106 of gallium arsenide is deposited on the wafer by epitaxy. In this case we preferentially use molecular beam epitaxy or metal organic chemical vapor deposition (MOCVD). Following this deposition of gallium arsenide, a layer 106 of good quality monocrystalline gallium arsenide is obtained at the points where the layer of intrinsic silicon exists. The drain and gate electrodes are made in this layer of gallium arsenide. At the points where the silica pads 105 exist, we obtain either a layer 107 of polycrystalline GaAs, or no deposit when selective epitaxy, for example by flux modulation, is used. The layer of monocrystalline GaAs is approximately 3 to 4 $\mu$m thick. Then, using a conventional field-effect transistor manufacturing process, the gate metallizations 108 of Ti-Al and the drain and source metallizations 109 and 110 are made on the monocrystalline GaAs with superposed metal layers such as Au-Ge-Ni-Au.

Figure 4F:
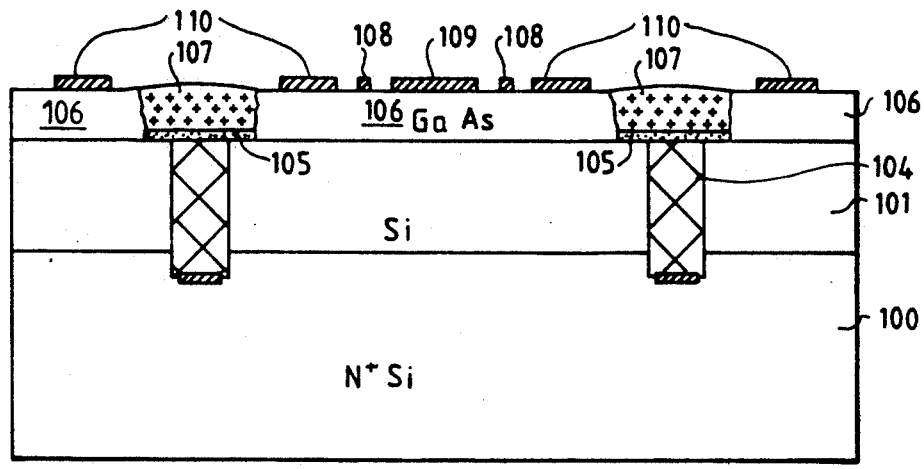

As represented in FIG. 4f, two source metallizations 110 surround each sink 102.

Figure 4G:
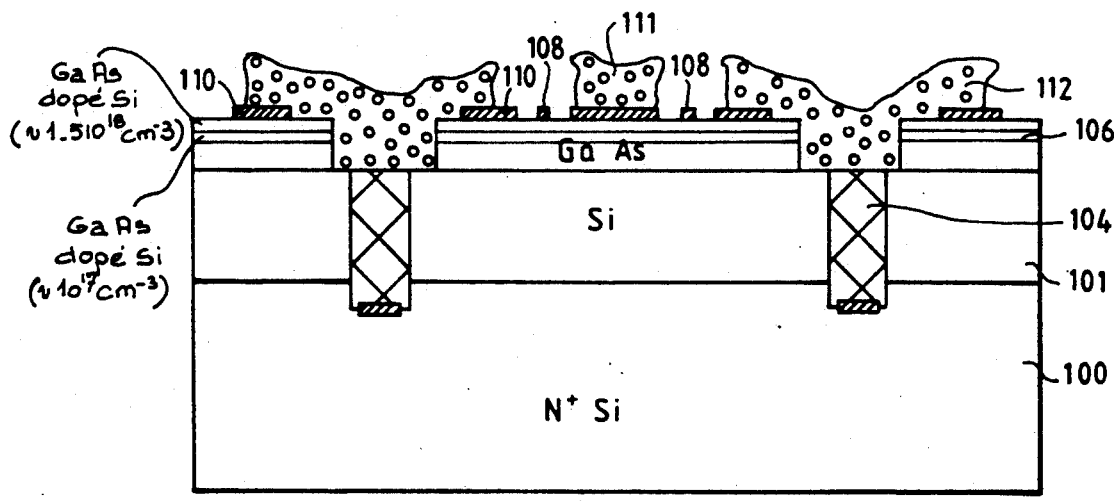

Then, as represented in FIG. 4g, the layers of polycrystalline GaAs and silica are etched in known manner to reach the electrolytic gold having recharged the sinks 102. The drain and source contacts of Ti-Pt-Au are then recharged in known manner so as to complete the manufacturing process of this transistor. Then, as in the first manufacturing process, the back face of the conducting silicon substrate can be ground and a metallization (not shown) can be deposited to make an access electrode to the sources.

As mentioned above, one of the advantages of this process lies in the fact that the ohmic contact on the conducting silicon substrate is made before the deposit of GaAs by epitaxy, i.e. before any technological stage on the gallium arsenide. It is therefore possible to anneal the ohmic contact on silicon at temperatures of over 400° C., which means that the ohmic contacts with the silicon can be optimized. The manufacturing process shown in FIGS. 4a to 4g illustrates the manufacture of a powerful transistor with an interdigital gate structure.

We shall recapitulate below all the advantages of this new powerful transistor in 3-5 group material on a silicon substrate. This new transistor has heat dissipation which is optimized in comparison with a transistor made on a GaAs substrate, which enables powerful transistors to be made. In addition, the use of a buffer layer of intrinsic silicon enables the gate-source and drain-source capacitances to be less than those in the transistor described in French patent application no. 88 13155. This reduction in capacitances brings a noticeable improvement in microwave performances. In addition, there is a reduction in drain-source current leaks since there is a thick buffer layer comprising a semi-insulating layer of gallium arsenide about 2 $\mu$m thick associated with a buffer layer of intrinsic silicon of at least 10 $\mu$m. This reduction of drain-source current leaks enables the transistor to be polarized at higher drain-source tensions. Consequently, the transistor can provide a higher power. Moreover, the transistor is made using an entirely front-facing technique, which improves the manufacturing yield.

What is claimed is:

1. A transistor comprising a silicon substrate, at least one layer of semi-insulating 3-5 group material and several doped layers of 3-5 group semiconductor material through which is defined at least one conducting channel equipped with a gate metallization, each channel being situated between two access regions known alternately as source and drain, each with a metallization, one of the two regions of access to a channel being electrically and thermally connected to the silicon substrate, between the silicon substrate and the semi-insulating layer of 3-5 group material, at least one buffer layer of intrinsic silicon.

2. The transistor according to claim 1, wherein the buffer layer of silicon is at least 10 $\mu$m thick.

3. The transistor according to claim 2, wherein the layer of semi-insulating 3-5 group material is about 4 $\mu$m thick.

4. The transistor according to claim 1, wherein the substrate is selected from the group consisting of N+ and P+ doped silicon.

5. The transistor according to claim 1, wherein the connection between one of the access regions and the silicon substrate is formed by a metal core which crosses the layers of 3-5 group semiconductor material and intrinsic silicon and makes an ohmic contact on the substrate at the interface with the layer of intrinsic silicon.

6. The transistor according to claim 1, wherein the 3-5 group semiconductor materials are selected from the group consisting of binary compositions of Ga, As, Al, In and P, and ternary compositions of Ga, As, Al, In and P.

7. A transistor having 3-5 group semiconductor material on silicon comprising a silicon substrate, at least one layer of semi-insulating 3-5 group material and several doped layers of 3-5 group semiconductor material with at least one conducting channel having a gate metallization, each channel being situated between source and drain regions, each source and drain region, with a metallization, one of said source and drain regions being electrically and thermally connected to the silicon substrate and having between the silicon substrate and the semi-insulating layer of 3-5 group material, at least one buffer layer of intrinsic silicon.

* * * * *